United States Patent
Yamaguchi et al.

[11] Patent Number: 6,072,205
[45] Date of Patent: Jun. 6, 2000

[54] PASSIVE ELEMENT CIRCUIT

[75] Inventors: Keiko Yamaguchi; Naotaka Iwata, both of Tokyo, Japan

[73] Assignee: NEC Corporation, Tokyo, Japan

[21] Appl. No.: 09/090,533

[22] Filed: Jun. 4, 1998

[30] Foreign Application Priority Data

Jun. 4, 1997 [JP] Japan .................................. 9-146696

[51] Int. Cl.[7] .......................... H01L 29/80; H01L 31/112
[52] U.S. Cl. .......................... 257/277; 257/531; 257/532
[58] Field of Search .................................. 257/275, 277, 257/528, 531, 532

[56] References Cited

FOREIGN PATENT DOCUMENTS

| 0 683 519 | 11/1995 | European Pat. Off. . |
|---|---|---|
| 3-21857 | 3/1991 | Japan . |
| 3-184367 | 8/1991 | Japan . |
| 5-110311 | 4/1993 | Japan . |
| 6-275780 | 9/1994 | Japan . |
| 7-106515 | 4/1995 | Japan . |
| 8-88523 | 4/1996 | Japan . |
| 8-116028 | 5/1996 | Japan . |
| 8-330517 | 12/1996 | Japan . |

OTHER PUBLICATIONS

Silicon Processing for the VLSI Era, vol. 2, Lattice Press, S. Wolf, pp. 635–638, 1990.

Primary Examiner—Valencia Martin-Wallace
Assistant Examiner—George C. Eckert, II
Attorney, Agent, or Firm—Young & Thompson

[57] ABSTRACT

A passive element circuit is formed by a spiral inductor, a high-dielectric-constant thin-film capacitor, a via hole, and a bonding pad. By using $SrTiO_3$ as the high-dielectric-constant thin-film, which exhibits a dielectric constant of 200 up to a frequency of 20 GHz, it is possible to achieve a reduction of the capacitor surface area to approximately 1/30 of the area formerly required when using a $SiN_x$ (dielectric constant up to 6.5). Two high-dielectric-constant thin-film capacitors, a via hole for grounding, and a bonding pad are disposed at the center, which are surrounded by the spiral inductor. To connect the two high-dielectric-constant thin-film capacitors are joined in series, they are formed on one high-dielectric-constant thin-film. A lead from the spiral inductor is made by a metal wire from the bonding pad at the center.

11 Claims, 3 Drawing Sheets

PASSIVE ELEMENT CIRCUIT

BACKGROUND OF THE INVENTION

1. Field of the Invention

The present invention relates to a monolithic microwave integrated circuit (MMIC) which handles microwave or millimeter wave signals used in such applications as mobile communications, and more specifically to the achievement of a compact passive element circuit.

2. Description of Related Art

A monolithic microwave IC is formed by integrating onto a substrate of GaAs or the like transistors as an active element and passive elements such as spiral inductors, interdigital capacitors, MIM capacitors, transmission paths, and thin-film resistors.

In a monolithic microwave IC in the past, and particularly in a high-output monolithic microwave IC, one problem was that of how to achieve compactness and reduce losses in the input and output matching circuits. This was because of it not being possible to achieve a compact capacitor with high capacitance and because of the difficulty in reducing the loss in lines that form such elements as inductors.

FIG. 5 shows an example of a matching circuit of a monolithic microwave IC amplifier of the past. This includes a spiral inductor 501 and a thin-film capacitor 502 made from $SiN_x$ or the like, for the purpose of impedance matching. Because the use of thin-film capacitors to serve as large-capacitance capacitors between stages occupies a large part of the chip surface area and represents a hindrance to the achievement of compactness, the approach taken is that of providing this in the form of a chip capacitor 503 that is external to the monolithic microwave IC.

As indicated in the Japanese Unexamined Utility Model Publication No.03-21857, there has been a study made of a method to laminate a spiral inductor pattern on top of a capacitor after formation of an insulation film. As indicated in the Japanese Unexamined Patent Publication No.05-110311, there has been a study of a circuit in which a stripline or inductor is formed on a dielectric layer having a high dielectric coefficient over a dielectric layer having a lower dielectric coefficient.

The spiral inductor 501 that has been used is one in which, after the lead line 504 is formed using an electrode metal, an insulation film is deposited, over which metallic plating of the spiral part is done to implement the wiring.

However the above-noted configuration, in which a capacitor is provided external to the monolithic microwave IC, made it difficult to achieve a cost reduction by means of the adoption of an monolithic microwave IC. Also, the method of forming the above-noted inductor on top of an insulation film or on top of a dielectric layer involves a complex process, in addition to the problem of achieving low inductor loss.

With the above-noted inductor forming method, because of the high resistance of the lead, it is difficult to achieve an advantage in terms of lowered resistance by making the plating of the inductor part thick.

In view of the above-described drawbacks in the prior art, an object of the present invention is to provide a passive element circuit which features compactness and low loss, and which is also both simple and can be formed with good repeatability.

SUMMARY OF THE INVENTION

To achieve the above-noted object, a first passive element circuit according to the present invention is formed by a high-dielectric-constant thin-film capacitor, a spiral inductor, a via hole for grounding, and bonding pad, the configuration being one in which two high-dielectric-constant thin-film capacitors in series, a via hole, and a bonding pad are disposed in the center of the spiral inductor.

The present invention also includes a means for making a lead from the spiral inductor by bonding from the center bonding pad.

The present invention also includes a means of forming the two high-dielectric-constant thin-film capacitors, which are connected in series, on one high-dielectric-constant thin-film.

The second passive element circuit according to the present invention is formed by a high-dielectric-constant thin-film capacitor, a spiral inductor, a via hole, and bonding pad, the configuration being one in which the highdielectric-constant thin-film capacitor, the via hole, and the bonding pad are disposed in the center of the spiral inductor.

The present invention also includes a means for making a lead from the spiral inductor by bonding from the center bonding pad.

The present invention also includes a means for making the wire length of the spiral inductor be ¼ of a wavelength corresponding to a desired frequency, thereby causing shortening for the second harmonic frequency, so that the efficiency of the amplifier circuit is improved.

By using a high-dielectric-constant thin-film capacitor, it is possible to achieve a prominent reduction in capacitor surface area in comparison with a $SiN_x$ capacitor of the past. For example, in the case of using an $SrTiO_3$ thin-film capacitor (dielectric constant up to 200), it is possible to reduce the capacitor surface area to approximately ⅟30 of what it is for the case of an $SiN_x$ thin-film capacitor (dielectric constant up to 6.5) of the past. For this reason, it is possible to form a large-capacitance capacitor within the monolithic microwave IC for the purpose of blocking DC bias, which was implemented external to the monolithic microwave IC in the past, this being an effective means of reducing mounting cost and also reducing the chip size. Also, by using a high-dielectric-constant thin-film capacitor, in a circuit having a spiral inductor and a capacitor, it is possible to dispose the capacitor at the center of the spiral inductor, thereby contributing to a reduction in the chip size.

By forming two high-dielectric-constant thin-film capacitors on one high-dielectric-constant thin-film, it is possible to prevent a deterioration in characteristics caused by edge damage when processing the capacitor, thereby enabling the achievement of capacitor characteristics with good repeatability.

By making a lead from the spiral inductor by bonding from the center bonding pad, it is possible to replace the high-resistance lead wire of the past with a low-resistance bonding wire, thereby resulting in a significant reduction in resistance. For example, the resistance of a gold wire having a diameter of 30 $\mu$m is a very low value of 0.004 ohms/mm. This enables the achievement of a low-resistance inductor by merely thickly plating the spiral part with gold.

In a power supply circuit, by making the length of the wiring of the spiral inductor from the start of the inductor to the end of the inductor be $\lambda/4$ corresponding to a desired frequency, thereby causing shortening for the second harmonic frequency, and enabling an improvement in the efficiency of an amplifier.

DETAILED DESCRIPTION OF THE PREFERRED EMBODIMENTS

Embodiments of present invention are described below, with reference being made to the relevant accompanying drawings.

Figure 1:
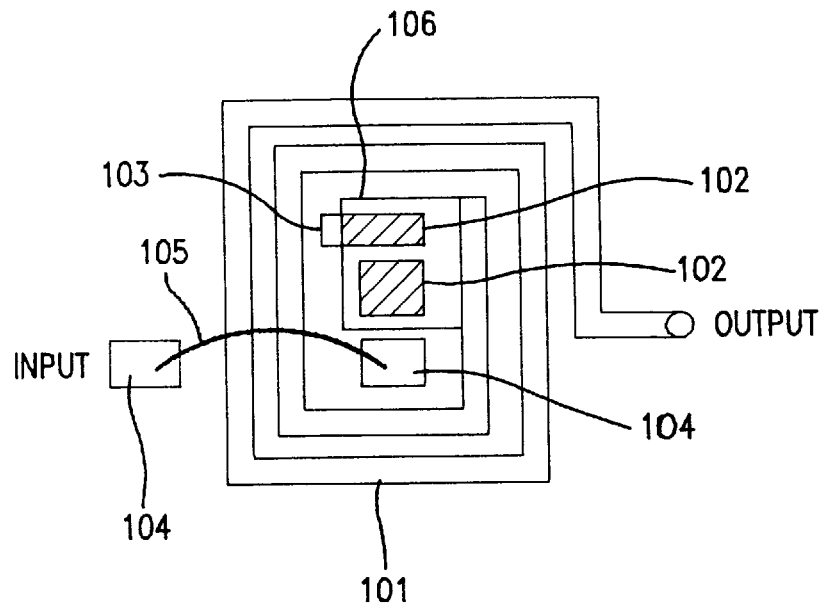
FIG. 1 is a schematic plan view which shows the first embodiment of the present invention.
Figure 2:
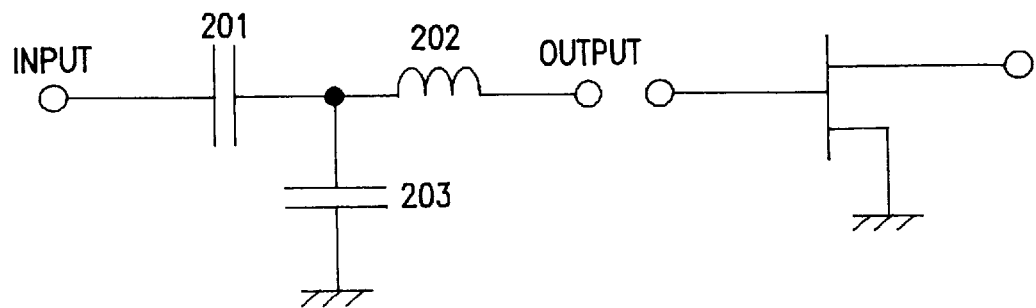
FIG. 2 is an equivalent circuit diagram of the first embodiment of the present invention.

FIG. 1 shows an input matching circuit formed by a passive element circuit according to the present invention. FIG. 2 is an equivalent circuit diagram of this passive element circuit, which is made up of a large-capacitance capacitor 201 for the purpose of blocking DC bias, and a series inductor 202 and capacitor 203 for the purpose of impedance matching.

The passive element circuit shown in FIG. 1 is formed by a spiral inductor 101 formed by metal plating the upper electrode 102,102 of the high-dielectric-constant thin-film capacitor, a via hole 103 for grounding, and bonding pads 104. Materials for high-dielectric-constant films that can be used for the capacitor include such materials as $(Ba_xSr_{1-x})TiO_3$, $Pb(Zr_xTi_{1-x})O_3$, $SrBi_2Ti_{2-x}Nb_xO_9$, $BaTiO_3$, $PbTiO_3$, and $SrTiO_3$.

Of these high-dielectric-constant thin-films, using $SrTiO_3$, as indicatedin Japanese JournalofApplied Physics, Vol. 35, pp L1683-1684, Part 2, No. 12B, Dec. 15, 1996, by using RF sputtering to form this on a GaAs substrate at a growth temperature of 450 degrees, it is possible to attain a dielectric constant of 200 up to a frequency of 20 GHz. By doing this, it is possible to reduce the surface area of the capacitor to approximately 1/30 of the surface area of a $SiN_x$ thin-film capacitor (dielectric constant up to 6.5) used in the past. For example, the size of a 70 pF capacitor used between stages is just $100 \times 50$ $\mu m^2$. The two upper electrodes 102, 102 of the high-dielectric-constant thin-film capacitor, the via hole 103 for grounding, and the bonding pads 104 are disposed at the center, which are surrounded by the spiral inductor 101. To connect the two high-dielectric-constant thin-film capacitors 102 in series, these are formed on a single high-dielectric-constant thin-film and lower electorde 106. Because this prevents a deterioration of characteristics that would be caused by edge damage during processing of the capacitors, this is an advantage in terms of repeatability of capacitor characteristics. A lead from the spiral inductor to the input pad 104 is made by using a metal bonding wire from the center bonding pad.

Figure 3:
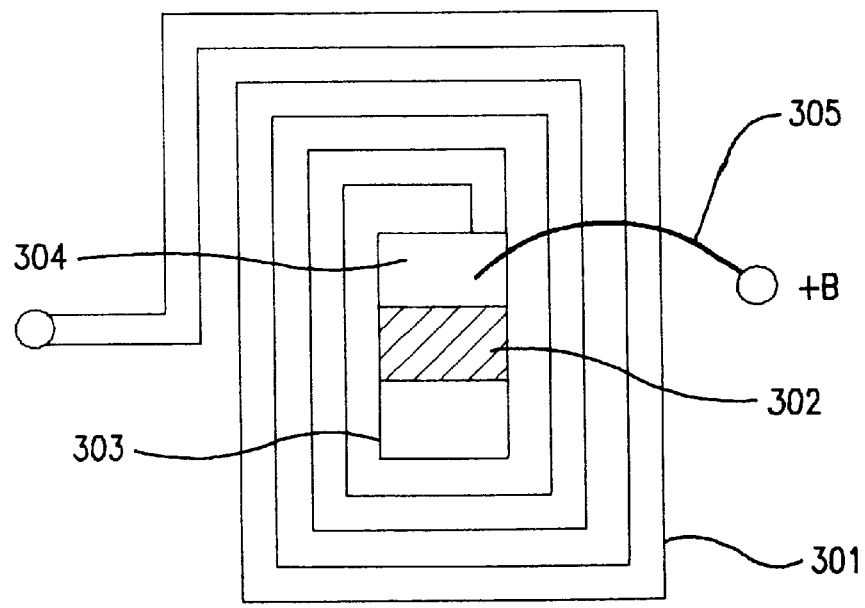
FIG. 3 is a schematic plan view which shows the second embodiment of the present invention.
Figure 4:
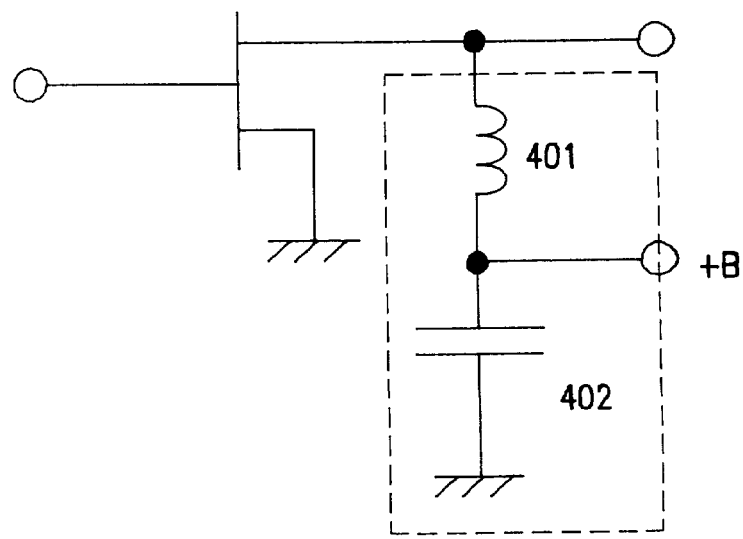
FIG. 4 is an equivalent circuit diagram of the second embodiment of the present invention.
Figure 5:
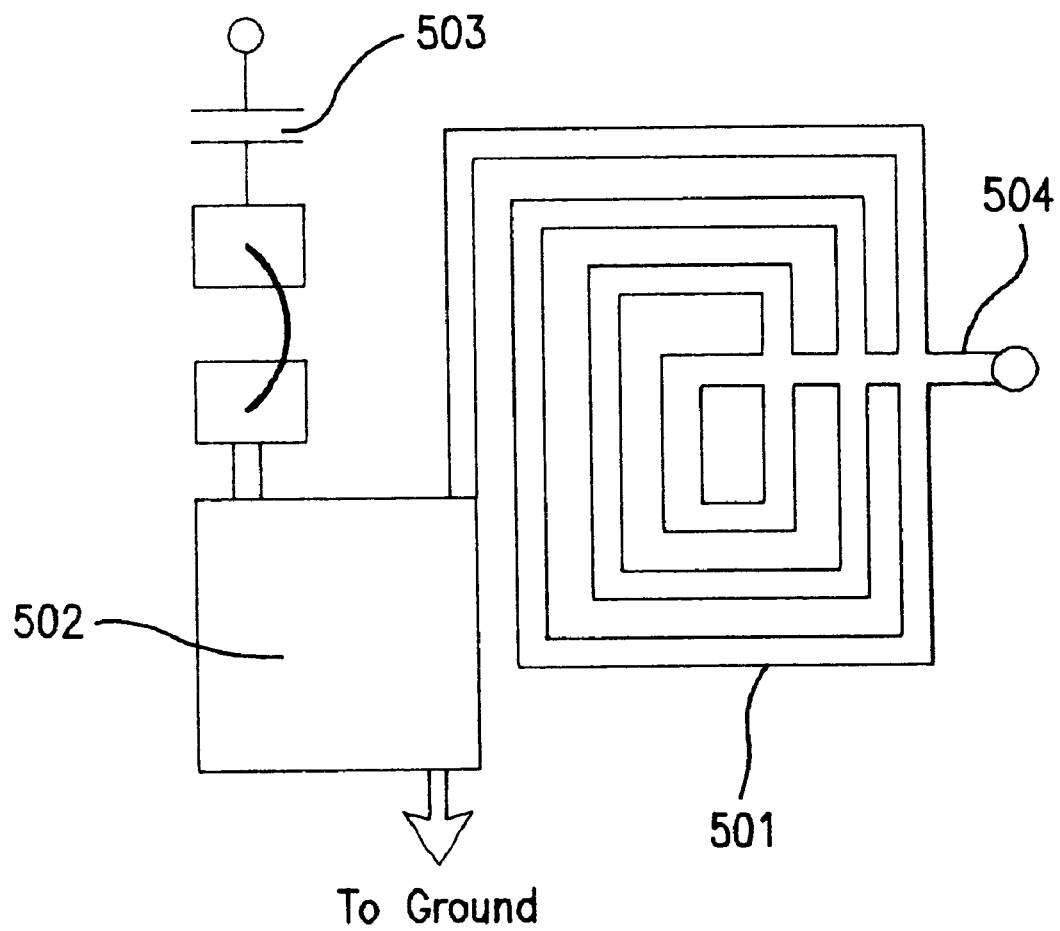
FIG. 5 is a schematic plan view which shows an example of a matching circuit of a monolithic microwave IC of the prior art.

FIG. 3 shows an output matching circuit formed by a passive element circuit according to the present invention. FIG. 4 is an equivalent circuit diagram of this passive element circuit, which is made up of a parallel inductor 401 and a capacitor 402 which is used for blocking DC bias and shorting RF signals.

The passive element circuit shown in FIG. 3 is formed by a spiral inductor 301 formed by metal plating, the high-dielectric-constant thin-film capacitors 302, a via hole 303 for grounding, and a bonding pad 304. Materials for high-dielectric-constant films that can be used for the capacitor include such materials as $(Ba_xSr_{1-x})TiO_3$, $Pb(Zr_xTi_{1-x})O_3$, $SrBi_2Ti_{2-x}Nb_xO_9$, $BaTiO_3$, $PbTiO_3$, and $SrTiO_3$.

Of these high-dielectric-constant thin-films, using $SrTiO_3$, as indicated in Japanese Journal of Applied Physics, Vol. 35, pp L1683-1684, Part 2, No. 12B, Dec. 15, 1996, by using RF sputtering to form this on a GaAs substrate at a growth temperature of 450 degrees, it is possible to attain a dielectric constant of 200 up to a frequency of 20 GHz. By doing this, it is possible to reduce the surface area of the capacitor to approximately 1/30 of the surface area of a $SiN_x$ thin-film capacitor (dielectric constant up to 6.5) used in the past. For example, the size of a 70 pF capacitor used between stages is just $100 \times 50$ $\mu m^2$. The high-dielectric-constant thin-film capacitor 302, the via hole 303 for grounding, and the bonding pad 304 are disposed at the center, which are surrounded by the spiral inductor 301.

In the spiral inductor 301, by making the length of the wiring of the spiral inductor from the start of the inductor to the end of the inductor be ¼ of a wavelength($\lambda$) corresponding to a desired frequency, thereby causing shortening for the second harmonic frequency, and enabling an improvement in the efficiency of an amplifier. A lead from the spiral inductor to the pad is made by using a metal bonding wire 305 from the center bonding pad 304.

The first effect of the present invention is that, by using a high-dielectric-constant thin-film capacitor, it is possible to greatly reduce the surface area of the capacitor in comparison with an $SiN_x$ thin-film capacitor as used in the past. For example, using an $SrTiO_3$ thin-film capacitor (dielectric constant up to 200), it is possible to reduce the capacitor surface area to approximately 1/30 of that of an $SiN_x$ thin-film capacitor (dielectric constant up to 6.5). For this reason, it is possible to form a large-capacitance capacitor for the purpose of blocking DC bias inside the monolithic microwave IC, thereby reducing the mounting cost and the size of the chip.

The second effect of the present invention is that, by using a high-dielectric-constant thin-film capacitor, in a circuit having a spiral inductor and a capacitor, it is possible to dispose the capacitor inside the spiral inductor, this being advantageous in terms of achieving a compact chip.

The third effect of the present invention is that, by making a lead from the spiral inductor by bonding from the center bonding pad, it is possible to replace the high-resistance lead wire of the past with a low-resistance bonding wire, thereby resulting in a significant reduction in resistance. By doing this, it is possible to achieve a low-resistance inductor by merely making the metal plating on the spiral part thick.

The fourth effect of the present invention is that, by forming two continuous high-dielectric-constant thin-film capacitor on a single high-dielectric-constant thin-film, it is possible to prevent a deterioration of characteristics that would be caused by edge damage during processing of the capacitors, thereby enabling attainment of capacitor characteristics with good repeatability.

The fifth effect of the present invention is that, by making the length of the wiring of the spiral inductor from the start of the inductor to the end of the inductor be ¼ of a wavelength($\lambda$) corresponding to a desired frequency, thereby causing shortening for the second harmonic frequency, and enabling an improvement in the efficiency of an amplifier. At a higher harmonic order, by designing to for a short with respect to even harmonics and an open circuit with respect to odd harmonics, it is possible to achieve even higher efficiency.

What is claimed is:

1. A monolithic microwave integrated circuit (MMIC) comprising:

a spiral inductor having an opening at its center, a first end at an exterior of said spiral inductor, and a second end in said opening;

a high-dielectric-constant thin film in said opening connected to said second end;

a first high-dielectric-constant, DC bias blocking capacitor on and connected to said thin film and a second high-dielectric-constant, impedance matching capacitor on said thin film and connected to said first capacitor through said thin film and to ground;

an interior bonding pad in said opening spaced from said thin film and said capacitors and connected to said first capacitor.

2. The MMIC of claim 1, further comprising a metal bonding wire spaced from said spiral inductor that connects said interior bonding pad to a further bonding pad exterior to said spiral inductor.

3. The MMIC of claim 1, wherein said first end is an output end and said second end is an input end.

4. The MMIC of claim 1, wherein said first and second capacitors comprise a high-dielectric constant material selected from the group consisting of $(Ba_xSr_{1-x})TiO_3$, $Pb(Zr_xTi_{1-x})O_3$, $SrBi_3Ti_{2-x}Nb_xO_9$, $BaTiO_3$, $PbTiO_3$, and $SrTiO_3$.

5. The MMIC of claim 4, wherein said high-dielectric constant material comprises $SrTiO_3$.

6. A monolithic microwave integrated circuit (MMIC) comprising:

a spiral inductor having an opening at its center, a first end at an exterior of said spiral inductor, and a second end at an interior of said spiral inductor;

a high-dielectric-constant capacitor connected to ground for blocking a DC bias and shorting RF signals;

an interior bonding pad in said opening spaced from said capacitor and connected to said second end and to said capacitor; and a metal low-resistance bonding wire spaced from said spiral inductor that connects said interior bonding pad to a further bonding pad exterior to said spiral inductor.

7. The MMIC of claim 6, wherein said first end is an input end and said second end is an output end.

8. The MMIC of claim 6, wherein said capacitor comprises a high-dielectric constant material selected from the group consisting of $(Ba_xSr_{1-x})TiO_3$, $Pb(Zr_xTi_{1-x})O_3$, $SrBi_3Ti_{2-x}Nb_xO_9$, $BbTiO_3$, $PbTiO_3$, and $SrTiO_3$.

9. The MMIC of claim 8, wherein said highdielectric constant material comprises $SrTiO_3$.

10. The MMIC of claim 6, wherein said interior bonding pad is directly connected to said second end.

11. The MMIC of claim 6, wherein said bonding wire comprises gold.

* * * * *